United States Patent [19]

Kashida et al.

[11] Patent Number: 5,254,419
[45] Date of Patent: Oct. 19, 1993

[54] METHOD FOR DUST-PROOFING IN THE MANUFACTURE OF ELECTRONIC DEVICES AND PELLICLE THEREFOR

[75] Inventors: Meguru Kashida; Satoshi Watanabe, both of Gunma; Toshinobu Ishihara, Niigata; Yoshihiro Kubota, Gunma; Ikuo Fukui, Niigata, all of Japan

[73] Assignee: Shin-Etsu Chemical Co., Ltd., Tokyo, Japan

[21] Appl. No.: 817,438

[22] Filed: Jan. 6, 1992

[30] Foreign Application Priority Data

Jan. 14, 1991 [JP] Japan .................................. 3-014691

[51] Int. Cl.$^5$ .............................................. G03F 9/00
[52] U.S. Cl. ........................................... 430/5; 525/61
[58] Field of Search ............................. 430/5; 525/61

[56] References Cited
U.S. PATENT DOCUMENTS 5,036,137 7/1991 Sau ........................................ 525/61

Primary Examiner—Marion E. McCamish
Assistant Examiner—Mark A. Chapman
Attorney, Agent, or Firm—McAulay Fisher Nissen Goldberg & Kiel

[57] ABSTRACT

Disclosed is a method for dust-proofing of a photomask in the photolithographic processing of electronic devices, e.g., LSIs and liquid-crystal display panels, in which the photomask is covered with a pellicle having a frame-supported light-transmitting membrane made from a polyvinyl alcohol modified by silylating the hydroxy groups of the polyvinyl alcohol with triorganosilyl groups of the formula $R_3Si-$, in which R is a monovalent hydrocarbon group, e.g., alkyl, in a degree of substitution of at least 40%. The membrane of the pellicle is highly transparent to light of short wavelength in the ultraviolet region and excellently durable under prolonged irradiation with ultraviolet light not to cause yellowing or mechanical breaking.

4 Claims, No Drawings

METHOD FOR DUST-PROOFING IN THE MANUFACTURE OF ELECTRONIC DEVICES AND PELLICLE THEREFOR

BACKGROUND OF THE INVENTION

The present invention relates to a method for dust-proofing in the manufacturing process of electronic devices, such as semiconductor devices, e.g., LSIs and ULSIs, and liquid-crystal display panels and the like, and also relates to a pellicle used therefor. In particular, the invention relates to a method for dust-proofing of a photomask in the photolithographic processing of an electronic device by use of light having a wavelength of 500 nm or shorter by covering the photomask with a pellicle having excellent transparency in the wavelength region.

In the manufacture of semiconductor devices, such as LSIs and ULSIs, and liquid-crystal display panels and the like, the method of photolithography is widely undertaken for patterning on a semiconductor silicon wafer or a liquid-crystal master plate by patternwise exposure of the photoresist layer to light through a photomask bearing the desired pattern. When the photomask used here carries dust particles deposited thereon, the light beam is unevenly absorbed or scattered by the dust particles so that the pattern formed on the silicon wafer and the like is not a high-fidelity reproduction of the original pattern or the edge lines of the patterned areas may be rugged without smoothness sometimes with a decrease in the contrast of the patterned images resulting in a great decrease in the quality of the finished products.

Although the above mentioned works are usually performed in a dust-free clean room, it is an extremely difficult matter to keep the photomask in a perfectly dust-free condition throughout the procedure. A generally undertaken countermeasure in this regard is to cover the photomask with a transparent pellicle applied thereto. Various polymeric materials have been proposed and are under practical use as a material of such a pellicle including nitrocellulose, cellulose acetate and the like (see, for example, Japanese Patent Kokai 60-75835).

These conventional polymeric materials for pellicle have several disadvantages. For example, pellicles made from nitrocellulose or cellulose acetate have a relatively strong absorption band of light in the short wavelength region of 210 to 500 nm and they are relatively unstable to cause yellowing in the lapse of time so that such a pellicle can hardly be used in the photolithography for the manufacture of ULSIs or ultra-high density liquid-crystal display panels where it is essential to conduct the patterning by using light of an as short as possible wavelength in the ultraviolet region such as the light beams emitted from an excimer laser or so-called g-lines and i-lines.

The inventors have previously proposed use of a pellicle made from a polymer of vinyl trimethyl silane or a pullulan compound in place of nitrocellulose and cellulose acetate in Japanese Patent Kokai 2-5861 and 2-230254, respectively. The pellicles made from these polymeric materials have excellent light transmissivity even in the wavelength region of 210 to 500 nm and sufficiently stable against yellowing in the lapse of time but they are disadvantageous in respect of the poor mechanical strengths as compared with nitrocellulose so that no quite satisfactory dust-proofing effect can be obtained therewith.

SUMMARY OF THE INVENTION

The present invention accordingly has an object to provide a novel method for dust-proofing of a photomask in the photolithographic processing of electronic devices by using a pellicle which is free from the disadvantages and problems in the above described prior art methods using a pellicle of a conventional polymeric material.

Thus, the method of the present invention for dust-proofing of a photomask comprises: covering the photomask with a pellicle made from a polyvinyl alcohol of which the hydrogen atoms of at least 40% of the hydroxy groups are replaced each with a triorganosilyl group represented by the general formula $$R_3Si-, \qquad (I)$$

in which each R is, independently from the others, a monovalent hydrocarbon group.

DETAILED DESCRIPTION OF THE PREFERRED EMBODIMENTS

As is described above, the most characteristic feature in the inventive method consists in the use of a transparent pellicle made from a unique and specific polyvinyl alcohol modified with triorganosilyl groups of the general formula (I) given above. The pellicle of this modified polyvinyl alcohol has excellent transparency even to light having a wavelength of 400 nm or shorter so that the inventive method is applicable to the photolithographic work using an excimer laser or the i-lines without the disadvantages of yellowing of the pellicle in the lapse of time or eventual rupture of the pellicle membrane due to the poor mechanical strength.

The triorganosilyl-modified polyvinyl alcohol as the material of the pellicle used in the inventive method can be prepared from a conventional fully saponified polyvinyl alcohol which is water-soluble and capable of forming a film by casting of an aqueous solution or other known method. Although films of a plain polyvinyl alcohol are highly transparent and has high mechanical strengths, a problem therein consists in the hygroscopicity of the film to absorb moisture from the atmospheric air resulting in a decrease in the transparency if not to mention the difficulty in forming a very thin film from a polyvinyl alcohol.

It has been discovered that, when a polyvinyl alcohol is modified with triorganosilyl groups by substituting the triorganosilyl groups for a substantial portion of the hydrogen atoms of the hydroxy groups in the polyvinyl alcohol, the triorganosilyl-modified polyvinyl alcohol is no longer soluble in water but soluble in various hydrocarbon solvents such as toluene, xylene and the like to form a solution which can be cast to form a thin film of the modified polyvinyl alcohol having high transparency to light of short wavelength and stability as well as high mechanical strengths to be suitable as a pellicle used for dust-proofing of photomasks.

The polyvinyl alcohol from which the triorganosilyl-modified polyvinyl alcohol is prepared should be saponified as completely as possible leaving an as small as possible amount of the unsaponified acetate groups. It is preferable that the degree of saponification of the polyvinyl alcohol is at least 98%. The average degree of polymerization is not particularly limitative but preferably in the range from 1500 to 2000. When the average degree of polymerization is too low, the pellicle made from the triorganosilyl-modified polyvinyl alcohol would be poor in the mechanical properties while, when the average degree of polymerization is too high, certain difficulties are caused in the silylating reaction of the polyvinyl alcohol.

The triorganosilyl group as the substituent on the molecules of the polyvinyl alcohol is represented by the above given general formula (I), in which the group denoted by R is, each independently from the others, a monovalent hydrocarbon group. Examples of the monovalent hydrocarbon group as R include alkyl groups having 1 to 6 carbon atoms such as methyl, ethyl, propyl, butyl, pentyl and hexyl groups, cycloalkyl groups such as cyclohexyl group, alkenyl groups such as vinyl, allyl, isopropenyl, 1-butenyl and 1-pentenyl groups and aryl groups such as phenyl group although aryl groups are less preferred because a polymer modified with aryl groups usually has a strong absorption of light in the ultraviolet region. Preferred as R are alkyl groups such as methyl, ethyl, propyl and tert-butyl groups, of which methyl group is more preferable. Examples of the triorganosilyl groups $R_3Si-$ include trimethyl silyl, tripropyl silyl, dimethyl propyl silyl, dimethyl n-butyl silyl, dimethyl tert-butyl silyl and dimethyl cyclohexyl silyl groups.

It is preferable that the average degree of modification of the polyvinyl alcohol with the triorganosilyl groups is at least 40%. This means that at least 40% of the hydroxy groups in the polyvinyl alcohol are substituted by the triorganosilyl groups forming a monomeric unit of the formula $-CH_2-CH(-O-SiR_3)-$. More preferably, the degree of modification is in the range from 60 to 85%. When the degree of modification is too low, the pellicle prepared from the modified polyvinyl alcohol still retains hygroscopicity to be less stable and less transparent in a moisture-containing atmosphere. When the degree of modification is too high, on the other hand, the pellicle would be somewhat poor in the mechanical properties if not to mention the difficulty in the preparation of such a highly modified polyvinyl alcohol.

The triorganosilyl-modified polyvinyl alcohol can be prepared by silylating a polyvinyl alcohol with a suitable silylating agent corresponding to the desired triorganosilyl groups to be introduced. Examples of the silylating agents include triorganochlorosilane of the general formula $R_3SiCl$, triorganosilyl acetamide of the general formula $R_3SiO-C(CH_3)=N-SiR_3$, triorganosilyl trifluoroacetamide of the general formula $R_3SiO-C(CF_3)=N-SiR_3$, hexaorganosilyl disilazane of the general formula $R_3Si-NH-SiR_3$ and the like. These silylating agents are used as a solution in a solvent such as pyridine, N-methyl pyrrolidone and the like and the starting polyvinyl alcohol is dispersed in the solution of the silylating agent and heated therein to effect the silylating reaction. Alternatively, polyvinyl alcohol can be silylated by using a triorganosilyl perchlorate which is a known silylating agent for alcohols. Preferably, the silylating reaction is performed by using a triorganosilyl acetamide in N-methyl pyrrolidone or a triorganosilyl trifluoroacetamide in N-methyl pyrrolidone.

The thus prepared, triorganosilyl-modified polyvinyl alcohol is soluble in various organic solvents such as toluene, xylene, hexane and the like to form a solution so that a film of the polymer suitable for use as a pellicle can be easily prepared by casting the solution on a flat substrate plate using a spin coater, knife coater and the like followed by evaporation of the solvent. Alternatively, films of the polymer can be prepared by T-die extrusion method, inflation method and the like. The film used as a pellicle should have a thickness of at least 0.5 $\mu m$ in order to ensure sufficient mechanical strengths suitable for use as a pellicle. On the other hand, the film thickness should preferably not exceed 10 $\mu m$ in order that the pellicle prepared therefrom may have a high transmissivity to ultraviolet light of a wavelength as short as 210 nm even after the pellicle is provided with a reflection-preventing film of a low refractive index formed thereon. A pellicle used in the inventive method is prepared by adhesively bonding a film of the triorganosilyl-modified polyvinyl alcohol on a frame made, for example, from aluminum and the like to be in the form of a frame-supported membrane.

In the following, the pellicle used in the inventive method is described in more detail by way of examples as preceded by a description of the synthetic preparation of the triorganosilyl-modified polyvinyl alcohols.

Synthetic Preparation 1.

Into 300 g of N-methyl pyrrolidone were dispersed 35.2 g of a fully-saponified polyvinyl alcohol, referred to as PVA hereinbelow, having a degree of saponification of at least 99.0% and an average degree of polymerization of about 1700. The amount of the PVA corresponds to 0.80 mole of the monomeric units $-CH_2-CHOH-$. The dispersion was heated at 110° C. and admixed with 204.9 g (0.60 mole) of N,O-bis(tert-butyl dimethyl silyl) trifluoroacetamide of the formula $Me_2(tert-Bu)SiO-C(CF_3)=N-Si(tert-Bu)Me_2$, in which Me is a methyl group and tert-Bu is a tert-butyl group, followed by further continued agitation of the reaction mixture for 5 hours at 110° C. to effect the silylating reaction of the PVA.

Thereafter, the reaction mixture was admixed with 300 g of toluene and cooled to room temperature so that the mixture was separated into layers, of which the upper layer containing the silylated PVA was taken and poured into a large volume of methyl alcohol to precipitate the polymer. The precipitated polymer was collected by filtration and again dissolved in 400 g of toluene followed by re-precipitation of the polymer in methyl alcohol, collection of the precipitated polymer by filtration and vacuum-drying of the polymer at 100° C. to give 81.9 g of a product which was analyzed by the $^{13}C$-NMR method to find that it was a (tert-butyl dimethyl silyl)-modified PVA of which the degree of modification was 65%.

Synthetic Preparation 2.

Into 300 g of N-methyl pyrrolidone were dispersed 35.2 g of the same PVA as used in Synthetic Preparation 1 described above. The amount of the PVA corresponds to 0.80 mole of the monomeric units $-CH_2-CHOH-$. The dispersion was heated at 110° C. and admixed with 204.9 g (0.60 mole) of N,O-bis(tert-butyl dimethyl silyl) trifluoroacetamide followed by further continued agitation of the reaction mixture for 5 hours at 110° C. to effect the silylating reaction of the PVA. Thereafter, 48.8 g (0.24 mole) of N,O-bis(trimethyl silyl) acetamide were added to the reaction mixture which was further agitated for additional 5 hours at 110° C. to effect an additional silylating reaction.

The reaction mixture was admixed with 300 g of toluene and cooled to room temperature so that the mixture was separated into layers, of which the upper layer containing the silylated PVA was taken and poured into a large volume of methyl alcohol to precipitate the polymer. The precipitated polymer was collected by filtration and again dissolved in 500 g of toluene followed by re-precipitation of the polymer in methyl alcohol, collection of the precipitated polymer by filtration and vacuum-drying of the polymer at 100° C. to give 111.5 g of a product which was analyzed to find that it was a (tert-butyl dimehyl silyl)- and trimethylsilyl-co-modified PVA of which the degrees of modification were 64% for the tert-butyl dimehyl silyl groups and 18% for the trimethyl silyl groups.

EXAMPLE 1

A 10% solution prepared by dissolving 10 g of the modified PVA prepared in Synthetic Preparation 1 described above in 90 g of toluene was cast on a well polished substrate plate of fused quartz glass having a thickness of 3 mm and a diameter of 200 mm by using a spin coater followed by drying to give a transparent film having a thickness of 1.2 μm.

The film was taken by peeling off the substrate plate and transferred on to a Teflon frame of 150 mm diameter on which it was subjected to thorough drying by heating for 5 hours at 80° C. in a vacuum oven. The dried film was mounted on and adhesively bonded in a slack-free fashion to a square aluminum frame of 100 mm a side by using an epoxy adhesive to give a frame-supported pellicle.

Measurements of the light transmission through the pellicle were conducted to the light beam emitted from an excimer laser having a wavelength of 248 nm, i-line having a wavelength of 365 nm and g-line having a wavelength of 436 nm to give the results shown in Table 1 below. Further, the pellicle was irradiated continuously with the i-line light in an intensity of 90 watts/cm$^2$ and the light transmission of the pellicle was determined after every 500 hours up to 1500 hours to give the results shown in Table 2 below. No noticeable changes could be detected in the pellicle after 1500 hours of i-line irradiation by the visual inspection such as yellowing and formation of fissures. Accordingly, the pellicle could be used quite satisfactorily for dust-proofing of a photomask.

EXAMPLE 2

A film having a thickness of 1.3 μm was prepared from the modified PVA obtained in Synthetic Preparation 2 described above in the same maner as in Example 1 and a frame-supported pellicle was prepared therefrom also in the same manner as in Example 1, which was subjected to the measurements of the transmission to the lights of 248, 365 and 436 nm wavelengths as well as the durability test under i-line irradiation in the same manner as in Example 1 to give the results shown in Tables 1 and 2, respectively. No noticeable changes could be detected in the pellicle after 1500 hours of i-line irradiation by the visual inspection such as yellowing and formation of fissures. Accordingly, the pellicle could be used quite satisfactorily for dust-proofing of a photomask.

COMPARATIVE EXAMPLE

A film of nitrocellulose having a thickness of 1.2 μm was prepared by the casting method from a 10% solution of a nitrocellulose of about 85% of the degree of nitration dissolved in ethyl acetate. A frame-supported pellicle was prepared from the nitrocellulose film in the same manner and subjected to the same tests as in the preceding examples to give the results shown in Tables 1 and 2 given below.

TABLE 1

| | Transmission, %, of light of wavelength | | |
|---|---|---|---|
| | 248 nm | 365 nm | 436 nm |
| Example 1 | 96.0 | 98.0 | 98.0 |
| Example 2 | 95.0 | 96.0 | 97.0 |
| Comparative Example | 41.0 | 95.0 | 96.0 |

TABLE 2

| | Transmission, %, after i-line irradiation for | | | |
|---|---|---|---|---|
| | (initial) | 500 hours | 1000 hours | 1500 hours |
| Example 1 | 98.0 | 97.5 | 98.0 | 98.0 |
| Example 2 | 96.0 | 95.5 | 96.5 | 96.0 |
| Comparative Example | 95.0 | 80.0 | 62.5 | 47.0 |

What is claimed is:

1. A method for dust-proofing of a photomask which comprises: covering the photomask with a pellicle of a film made from a polyvinyl alcohol of which the hydrogen atoms of at least 40% of the hydroxy groups are replaced each with a triorganosilyl group represented by the general formula $$R_3Si—,$$

in which each R is, independently from the others, a monovalent hydrocarbon group.

2. The method for dust-proofing of a photomask as claimed in claim 1 in which the film of the pellicle has a thickness in the range from 0.5 to 10 μm.

3. The method for dust-proofing of a photomask as claimed in claim 1 in which the group denoted by R is an alkyl group having 1 to 6 carbon atoms.

4. The method for dust-proofing of a photomask as claimed in claim 1 in which the polyvinyl alcohol has an average degree of polymerization in the range from 1500 to 2000.

* * * * *